United States Patent [19]

Butler et al.

[11] 3,819,954

[45] June 25, 1974

[54] SIGNAL LEVEL SHIFT COMPENSATION IN CHARGE-TRANSFER DELAY LINE CIRCUITS

[75] Inventors: Walter J. Butler; Mark B. Barron, both of Scotia; Bruno Kurz, Schenectady, all of N.Y.

[73] Assignee: General Electric Company, Schenectady, N.Y.

[22] Filed: Feb. 1, 1973

[21] Appl. No.: 328,642

[52] U.S. Cl. .......................... 307/221 D, 317/235 G

[51] Int. Cl. .......................................... H03k 25/02

[58] Field of Search .................... 307/221 D, 221 C; 317/235 G

[56] References Cited

UNITED STATES PATENTS

| | | | |
|---|---|---|---|
| 3,671,771 | 6/1972 | Sangster | 317/235 |
| 3,737,683 | 6/1973 | Sangster | 307/221 D |

OTHER PUBLICATIONS

IBM Tech. Discl. Bull. "Bucket-Brigade Delay Line with Loss Compensation" by Heller, Vol. 13, No. 12, May 1971, pages 3734–3735.

*Primary Examiner*—Jerry D. Craig

*Attorney, Agent, or Firm*—Louis A. Moucha; Joseph T. Cohen; Jerome C. Squillaro

[57] ABSTRACT

Compensation for undesired shifts in the D.C. voltage level of a signal being propagated through a charge-transfer delay line is provided by compensating stages spaced at regular intervals along the delay line. The compensating stages are preferably transistors of the same type as that used in the delay line and having their source (or drain) electrodes connected to appropriate nodes along the delay line and their gate electrodes supplied from a pulsed source of voltage having controllable voltage amplitude and pulse repetition rate. The drain (or source) electrodes are grounded for shifting the D.C. voltage level in a first polarity voltage direction and are open or connected to a D.C. voltage source for shifting in the opposite polarity voltage direction.

27 Claims, 5 Drawing Figures

SIGNAL LEVEL SHIFT COMPENSATION IN CHARGE-TRANSFER DELAY LINE CIRCUITS

Our invention relates to a monolithic integrated analog circuit of the charge-transfer delay line type, and in particular, to a means for providing compensation in the circuit for undesired D.C. voltage level shifts in the signal being propagated through the delay line circuit.

The recently developed charge-transfer delay line circuit is currently finding use in many applications such as audio and video delay, time-error correction, time-scale conversion and filtering as some examples. The charge-transfer delay line circuits include bucket-brigade circuits, charge-coupled circuits and surface-charge transistor circuits, but for simplification the description herein will be limited to the bucket-brigade circuit although our invention is applicable to the other types also. The bucket-brigade circuit is variously described as a sampled-data circuit or a digitally controlled analog charge transfer circuit, but may be most simply described as an analog signal shift register. The bucket-brigade circuit thus provides a means for realizing an electronically variable delay line which has many uses in analog signal processing. The bucket-brigade circuit, herein abbreviated to BBDL for bucket-brigade delay line, may be generally described as a series array of capacitors interconnected by suitable electronic switches which, when implemented in monolithic form, may be transistors of any type such as bipolar or the field effect type MOSFET, JFET or MESFET. Information is stored as charge packets in such array of capacitors and is caused to be propagated through the array at a rate determined by the (clock) rate at which the switches are sequentially opened and closed. The bucket-brigade circuit, therefore, provides a noninductive means for implementing an analog delay line, the delay period of which is controlled by an external clock, and recent advances in microelectronic technology permit implementation of the BBDL in single monolithic integrated circuit form.

The BBDL in integrated circuit form offers many advantages over a like circuit fabricated of discrete transistor and capacitor devices, the most obvious advantages being the compactness, lower power requirements and greater durability of the integrated circuit. However, the operation of a BBDL (and the other charge-transfer type delay lines) in integrated circuit form is adversely affected by a charge loss or gain, and other phenomenon that may occur as the analog signal samples propagate down the delay line. These loss mechanisms produce an undesired shifting effect on the D.C. voltage level of the signal and thereby reduce the dynamic range of the circuit and limit the maximum useful length of the delay line for a given operating frequency, or equivalently, reduce the operating range of frequencies for a fixed length of delay line.

Therefore, one of the principal objects of our invention is to provide a means for compensation of undesired D.C. voltage level shifts in the signal being propagated through a charge-transfer delay line.

A further object of our invention is to provide the compensation in a charge-transfer delay line fabricated in monolithic integrated circuit form.

Another object of our invention is for provide the compensation as an integral part of the charge-transfer circuit for incorporation on the same integrated circuit chip.

A still further object of our invention is to provide a means for compensation for undesired charge loss to, or gain from, the substrate during signal propagation down the delay line fabricated in integrated circuit form.

Briefly summarized, and in accordance with the objects of our invention, we provide compensating stages spaced at regular intervals along a charge-transfer delay line for compensation of undesired shifts in the D.C. voltage level of the signal being propagated through the delay line. The compensating stages are preferably field-effect transistors of the same type as that used in the delay line and having their source (or drain) electrodes connected to appropriate nodes along the delay line and their gate electrodes supplied from a pulsed source of voltage having controllable pulse repetition rate and preferably also having controllable voltage amplitude and controllable pulse duration. The drain (or source) electrodes are connected to the substrate for controllably shifting the signal D.C. level in a positive polarity voltage direction when the undesired level shift is in a negative polarity direction for a delay line fabricated of p-channel type field-effect transistor devices. The drain (or source) electrodes are open or connected to a D.C. voltage source for controllably shifting the signal D.C. level in a negative direction when the undesired level shift is in a positive polarity direction. The desired degree of compensation is obtained by proper selection of the compensating stage gating voltage pulse repetition rate, voltage amplitude and pulse duration to limit the D.C. level shift to that which occurs in one of the regular intervals of the delay line at which the compensating stages are located.

The features of our invention which we desire to protect herein are pointed out with particularity in the appended claims. The invention itself, however, both as to its organization and method of operation, together with further objects and advantages thereof, may best be understood by reference to the following description taken in connection with the accompanying drawings wherein:

Figure 1:
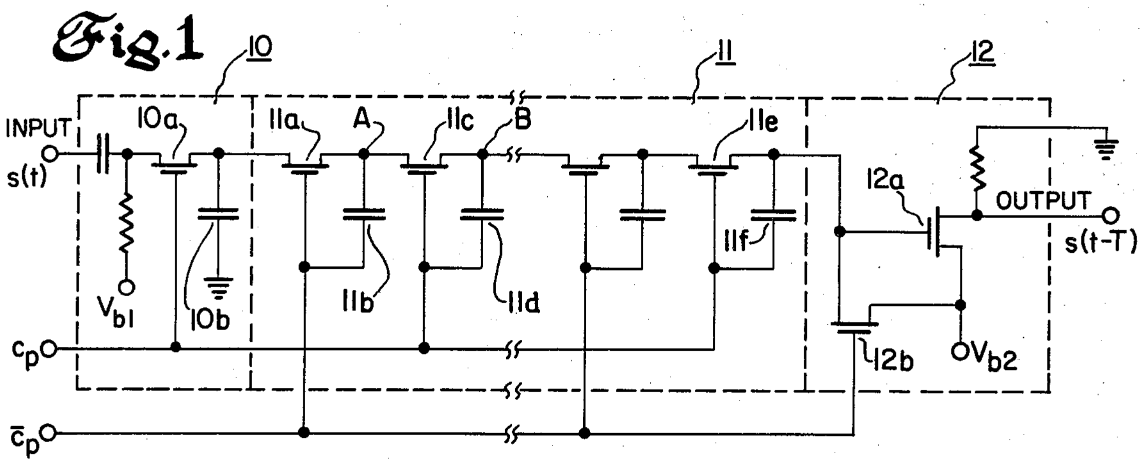
FIG. 1 is a schematic representation of a typical uncompensated bucket-brigade delay line circuit.

Referring now to FIG. 1, there is illustrated within the dashed outline, a typical BBDL consisting of an input sampling stage 10, a plurality of delay line stages 11, and an output stage 12. An analog input signal $s(t)$ applied to the INPUT terminal of the BBDL is generally of an alternating type having both positive and negative polarity components and is assumed to be sinusoidal although it can have other wave shapes and may also include a D.C. level. The delay line stages are clocked from a conventional two-phase digital clock pulse generator which provides 180° phase-displaced square wave clock pulse voltage signals $C_p$ and $\overline{C}_p$. The output of the BBDL is a delayed sampled-data signal waveform *s*(t—T) that switches at the clock frequency between sampled values of the analog input signal *s*(t) and a reference voltage level. The reference voltage level is equal to the gate voltage (i.e., clock signal voltage amplitude) minus the threshold voltage of the active (transistor devices in MOSFET BBDLs and is equal to the pinch-off voltage in JFET or MESFET BBDLs. The analog input signal is sampled at a sufficiently rapid (clock) rate such that the envelope of the sampled-data signal at the BBDL output faithfully follows the input signal waveform. The BBDL thus samples, holds and delays the analog input signal *s*(t) by a time T which is normally an integral number of (sampling) intervals $T_s$ at which the input signal is sampled.

Figure 3:
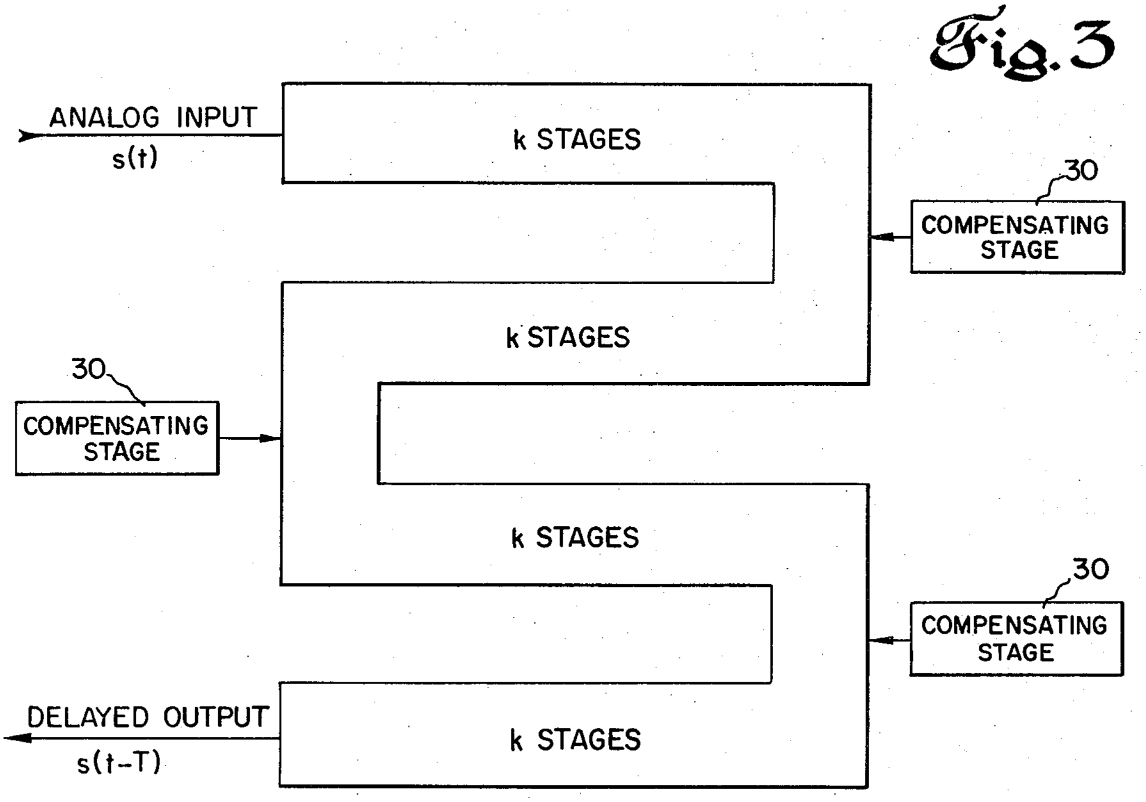
FIG. 3 is a block diagram representation of a bucket-brigade delay line with compensating stages spaced at the regular intervals therealong in accordance with our invention.
Figure 4:
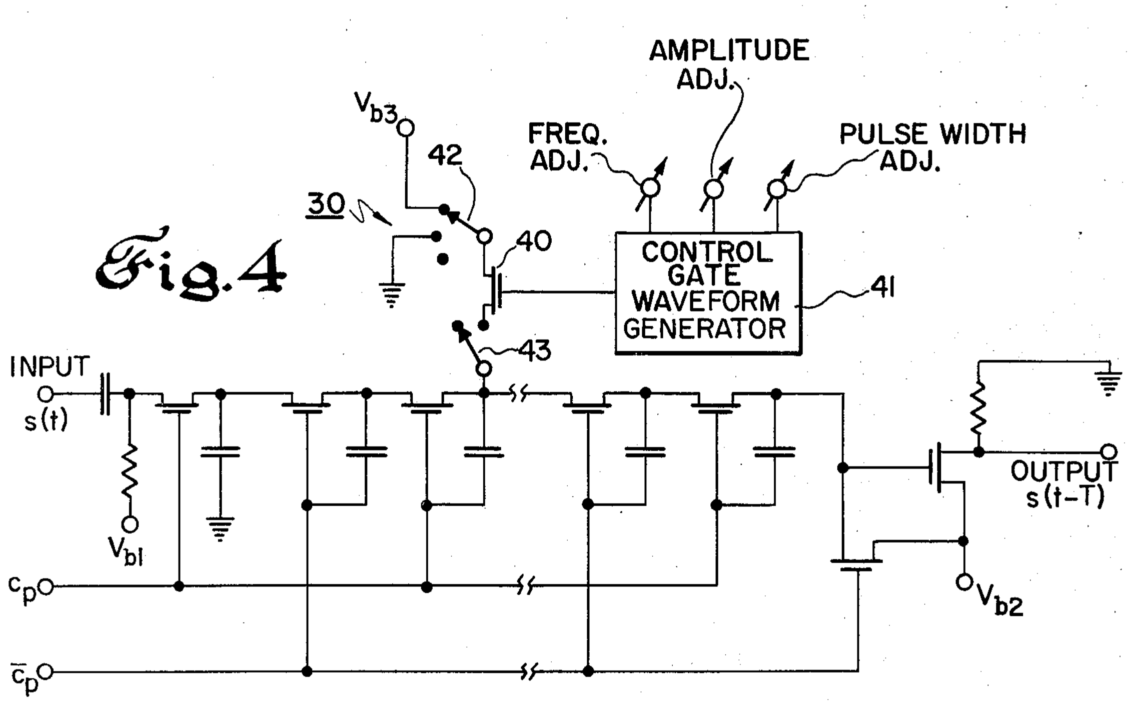
FIG. 4 is a schematic representation of a portion of the delay line illustrated in FIG. 3 and one of the compensating stages in accordance with our invention.

The input sampling stage 10 of the BBDL consists of a first electronic switch 10*a*, which is illustrated in FIG. 3 as a field effect transistor of the MOSFET type, although it can be any field-effect device such as the JFET or MESFET, or a bipolary type transistor. Depending upon the channel type semiconductor utilized in the fabrication of the BBDL, the analog input signal *s*(t) to the BBDL may be biased with a positive or negative voltage. Thus, in the case of p-channel type transistor devices, the analog input signal is biased from a source $V_{b1}$ of negative voltage for insuring that the signal applied to the source electrode of input sampling transistor 10*a* is always of negative polarity to prevent forward biasing of p-n junctions within the BBDL. In the case of n-channel type transistor devices, the input bias is of positive polarity.

Transistor 10*a* has its gate electrode connected to a common clock line supplied with the square wave clock pulses $C_p$. The drain electrode of transistors 10*a* is connected to a grounded (i.e., the substrate is generally at ground potential) capacitor 10*b* and to the source electrode of a like transistor 11*a* in the first stage of the delay line stages 11. The input signal sampling interval $T_s$ is thus controlled by the frequency of clock pulses $C_p$.

The plurality of delay line stages 11 are formed by serially connected pairs of bucket-brigade stages. Each pair of bucket-brigade stages includes two serially connected electronic switches (illustrated as MOSFETs in FIG. 1) and a charge packet storage capacitor connected across the drain and gate electrodes of each transistor. The electronic switch (herein exemplified as MOSFETs) in the BBDLs, as well as the storage capacitors, are all identical. The gate electrode of the first transistor in each delay line stage is also connected to the complementary clock pulse line $\overline{C}_p$ whereas the gate electrode of the second transistor is also connected to clock pulse line $C_p$. Thus, capacitor 11*b* is connected across the drain and gate electrodes of transistor 11*a*, and the gate electrode of transistor 11*a* is also connected to the $\overline{C}_p$ clock pulse line. The drain electrode of transistor 11*a* is connected to the source electrode of transistor 11*c* which together with capacitor 11*d* forms the second half of the first pair of bucket-brigade stages. Capacitor 11*d* is connected across the drain and gate electrodes of transistor 11*c*, and the gate electrode is also connected to the common clock line $C_p$. The drain electrode of transistor switch 11*c* is connected to the source electrode of a transistor in the following pair of bucket-brigade stages (not shown). The second and all further pairs of bucket-brigade stages are serially connected in the same manner as the first stage. The number of pairs of bucket-brigade stages determines the BBDL time delay, T, for a given clock frequency.

The clock voltage pulses which sample the input signal *s*(t) at the clock frequency are of negative polarity for bucket-brigades fabricated with p-channel MOSFET devices, and of positive polarity for n-channel MOSFET brigades. The output of the n-channel MOSFET BBDL is a positive polarity sampled and delayed voltage waveform *s*(t—T), and is a negative polarity waveform for a p-channel MOSFET BBDL.

The last bucket-brigade stage of the BBDL consists of transistor 11*e* and capacitor 11*f* connected across its drain and gate electrodes. The gate electrode of transistor 11*e* is also connected to the common $C_p$ clock pulse line, the source electrode is connected to the drain electrode of the previous bucket-brigade stage, and the drain electrode could comprise the output of the BBDL. However, for purposes of isolating the output of the BBDL, the output stage 12 is connected to the drain electrode of transistor 11*e*. The output stage 12 comprises a source-follower stage consisting of a transistor 12*a* having its gate electrode connected to the drain electrode of transistor 11*e*, its drain electrode connected to a source of direct current bias voltage $V_{b2}$ (of the same polarity as input bias $V_{b1}$) and its source electrode connected to the OUTPUT terminal of the BBDL. The BBDL output voltage is developed across a load resistor connected from the source electrode of transistor 12*a* to ground. A transistor 12*b* having its source electrode connected to the drain electrode of transistor 11*e*, its drain electrode connected to the source of bias voltage $V_{b2}$ and its gate electrode connected to the common complementary clock pulse line $\overline{C}_p$, is utilized as a switching device for precharging the last capacitor 11*f* in the BBDL to a ull charge. That is, transistor 12*b* permits filling the last "bucket" in accordance with conventional operation of BBDLs wherein the fullness of the buckets (the capacitor storage elements) proceeds from the last stage toward the first stage and the emptiness of such buckets, which contains the information (sampled analog input signal) to be propagated through the BBDL, proceeds from the first to the last stage. Thus, transistor 12*b* functions as a switch for providing (in conjunction with bias voltage $v_{b2}$) full charge of capacitor 11*f* prior to receiving an analog signal sample. The signal information is represented by the extent to which a full bucket is emptied, that is, the signal propagation through the BBDL from the input to the output ends is effected by means of a charge deficit transfer.

Operation of the conventional BBDL (and other type charge-transfer delay lines) illustrated in FIG. 1 often results in undesired shift of the D.C. voltage level of the signal being propagated through the delay line as stated hereinabove. Such shift occurs in each bucket-brigade stage, but for the purpose of simplification of illustration, the shift will be illustrated in FIG. 2 with reference to regular intervals along the delay line wherein each interval is defined as a particular (k) number of delay line stages. The undesired voltage level shifts are caused by many mechanisms. As two important examples in a monolithic fabricated BBDL, undesired voltage level shifts are caused by charge gain in the substrate as a result of a charge-pumping phenomenon (in the case of MOSFET brigades and equivalent phenomenon in other transistor type brigades) and charge loss as a result of reverse leakage current across p-n junctions in the circuit. The magnitude of this charge loss and gain is relatively independent of signal level and the primary effect on the operation of the circuit is therefore one of shifting of the D.C. voltage level of the signal samples.

The effect of the reverse leakage current mechanism will now be examined. During the one-half clock period for transfer of analog information (sampled input signal) from storage capacitor 11$b$ to storage capacitor 11$d$, quantities of charge $q_1$ and $q_2$ leak across the reverse-biased junctions that are represented by nodes A and B (in FIG. 1), respectively. During such transfer period, transistor 11$c$ is in a conductive state and transistor 11$a$ is non-conducting. Assume the initial voltage at node A is $-v_i$ volts corresponding to a specific signal sample, and the voltage at node B is $-(2V_g - V_t)$ volts, where $V_g$ is the applied gate (clock) voltage and $V_t$ is the threshold voltage of the transistor, and at the end of the transfer period, the voltage at node A is $-(V_g - V_t)$ volts. The total charge supplied to capacitor 11$b$ is therefore $-[(V_g - V_t - v_i)\, C + q_1]$ where C is the capacitance of capacitor 11$b$. The total charge leaving capacitor 11$d$ during the same period is therefore $[(V_g - V_t - v_i)\, C + q_1 + q_2]$. The resulting change in voltage at node B is therefore $$\delta V = (V_g - V_t - v_i) + [(q_1 + q_2)/C] \qquad 1.$$

where it is assumed that the capacitance of capacitors 11$b$ and 11$d$ are equal to each other. The voltage at node B at the start of the next transfer period is therefore $$\tilde{v}_i = -\left(v_i - \frac{q_1 + q_2}{C}\right) \qquad (2)$$

Thus, the voltage level $v_i$ (corresponding to a signal sample) has been shifted in a positive direction by an amount $\Delta V = (q_1 + q_2)/C$ during the transfer period of one-half clock period in the case of a p-channel field-effect transistor device BBDL. In the case of an n-channel field-effect transistor device BBDL, the D.C. level shift is in a negative polarity direction due to the reverse leakage current component of charge loss to the substrate.

During the next transfer period, a further quantity of charge $\tilde{q}_2$ is lost from node B to the substrate, and a quantity $q_3$ is lost from the following node (not shown). The voltage at such third node at the start of the next full cycle of clock voltage is therefore $-v_i + (q_1 + q_2 + \tilde{q}_2 + q_3)/C$, that is, the effect of the reverse leakage loss in cumulative. If the clock frequency is sufficiently low for a given length of delay line, or if the delay line is sufficiently long for a given clock frequency, the cumulative voltage shift $\Delta V$ becomes equal to $v_i$ and the analog information is lost.

The effect of the charge-pumping (or equivalent) mechanism will now be examined. Charge-pumping is a phenomenon that is unique to MOSFET devices. Each time that an MOS device is rendered conductive, the charge that is required to create the channel between the source and drain diffused regions is obtained primarily from the diffused drain-source regions. When the device is rendered nonconductive, a certain portion of this charge is lost to the substrate where it combines with the majority carriers. The charge-pumping current is expressed by the equation $$I_{cp} = A_g f\{-\alpha C_o\,(V_{gs} - V_t) + qN_{st}\} \qquad 3.$$

where $A_g$ is the gate area, $f$ is the clock frequency, $\alpha$ is a constant related to the device geometry, $N_{st}$ is the total fast-surface-state density contributing to the charge-pumping phenomenon, $V_{gs}$ is the gate-source voltage and $C_o$ is the oxide capacitance per unit area between gate electrode and substrate.

In the bucket-brigade circuit, voltage $V_{gs}$ approaches $V_t$ as the transfer of charge proceeds from one storage site (capacitor) to the next whereby the first term on the right-hand side of equation (3), (the so-called geometric component of $I_{cp}$), becomes negligible. Under these circumstances, the charge-pumping current is determined by $A_g$, $f$, and $N_{st}$ and is independent of the signal sample voltage. The net effect of this charge-pumping phenomenon is the pumping of positive charge (in the case of a p-channel device) from the drain (or source) regions into the substrate. This charge-pumping (or equivalent phenomenon) causes the drain (or source) potential to shift in a negative direction. In the case of an n-channel device BBDL, the D.C. level shift is in a positive polarity direction. Thus, the level-shifting that results from charge-pumping (or equivalent phenomenon) is in a direction opposite to that which results from reverse leakage current and hence charge-pumping (or its equivalent) may be described as a charge gain phenomenon.

Figure 2:
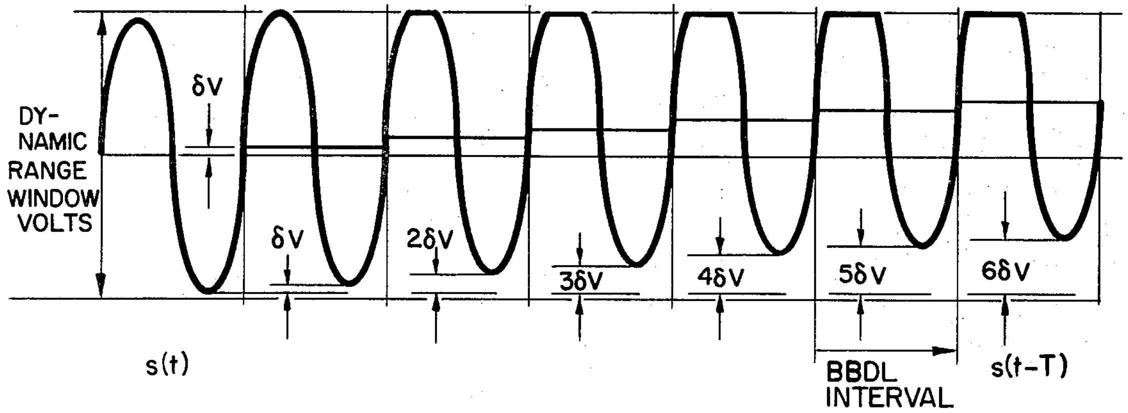
FIG. 2 is a series of voltage waveforms representing the sampled signal at regular intervals along the uncompensated delay line of FIG. 1 illustrating undesired shifts in D.C. voltage level of the signal.

Since the effect of reverse leakage current causes a D.C. level-shift in a positive polarity direction and the effect of charge-pumping (or its equivalent) causes a level-shift in a negative polarity direction (for p-channel field-effect transistor devices), some internal compensation always occurs in a bucket-brigade circuit. However, in particular applications of the circuit, one or the other of these two mechanisms (charge gain or loss) will generally predominate and therefore additional compensation is generally required, and is the subject of our invention. The net charge loss (or gain) results primarily in a reduction of the dynamic range of the BBDL circuit due to shift in D.C. level of the sampled signal. In high-frequency applications, the reverse leakage current effects may be negligible, and the charge-pumping (or equivalent) phenomenon predominates to cause a net D.C. voltage level-shift in a negative direction for a p-channel device BBDL. In low frequency applications, the leakage effects predominate thereby causing the level-shift in a positive polarity direction. This level-shift in the positive direction is illustrated in FIG. 2 which illustrates a sine wave input analog signal $s(t)$ and the envelope of the sampled signal existing at the nodes of every kth bucket-brigade stage in the delay line. Thus, each BBDL interval consists of at least two bucket-brigade stages, and in the general case consists of an even number of stages. As evident in FIG. 2, at the end of the first BBDL interval of $k$ bucket-brigade stages, the D.C. voltage level has shifted in a positive polarity direction by the voltage change $\delta$ V in accordance with equation (1). The cumulative nature of the reverse leakage loss is indicated in the subsequent BBDL intervals of $k$ stages with each additional interval suffering a further shift of the D.C.

level in a positive direction by the voltage change $\delta$ V. For purposes of emphasizing the loss in dynamic range of the circuit resulting from the undesired voltage level shift, the input signal $s(t)$ peak-to-peak amplitude is selected to be 2 $\delta$ V volts less than the dynamic range window of a theoretically loss-free bucket-brigade circuit. In the practical circuit without compensation for undesired level-shifting, it can be seen from FIG. 2 that the cumulative effects of such undesired level-shifting result in reduced dynamic range of the circuit due to increased clipping of the positive peaks of the waveform as the sampled signal progresses down the bucket-brigade delay line.

As stated above, the charge-pumping (or equivalent) phenomenon and junction leakage current losses have an adverse effect on bucket-brigade circuit operation in that such loss mechanisms reduce the dynamic range of the circuit and thereby limit the maximum useful length of delay line for a given operating frequency, or alternatively, reduce the operating range of frequencies for a fixed length of delay line. The charge-pumping loss in MOSFETs is determined by surface-stage densities, and may typically be in the range of 0.002 to 0.02 picocoulomb per square mil of channel area per clock period. The leakage current is typically in the range of 0.05 to 0.5 picoampere per square mil of junction area. Since the polarity of the D.C. level-shift that occurs as a result of charge-pumping (or equivalent phenomenon) is opposite to that which occurs as a result of leakage current, and one of such phenomenon is generally predominant in a particular bucket-brigade circuit application, the less predominant phenomenon can be utilized to compensate for the more predominant one.

Figure 5:
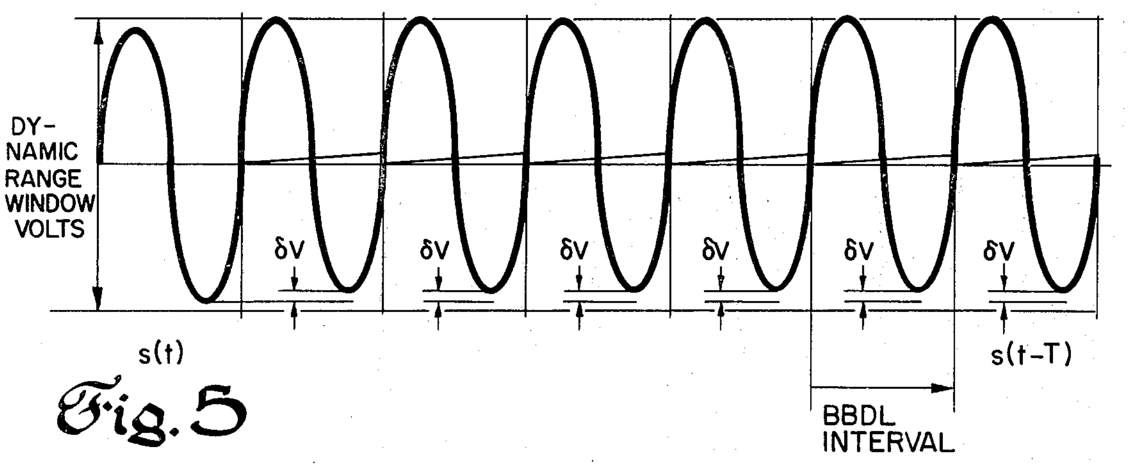
FIG. 5 is a series of voltage waveforms similar to FIG. 2 but illustrating the compensating effect of the compensating stages in accordance with our invention.

Our invention therefore is the incorporation of compensating stages spaced at regular intervals along the delay line for inducing the particular one of the charge-pumping (or equivalent phenomenon in the case of JFET and MESFET devices) or reverse leakage current loss phenomenon which is opposite to that of the predominant charge loss (or gain) phenomenon existing in the circuit. The connection of such compensating stages to (compensating) nodes of the delay line along small segments or portions of the delay line limits the D.C. level-shifting and resultant loss in dynamic range to that which would occur within one such small segment without compensation. Thus, as illustrated in FIG. 5, the use of compensating stages at each BBDL node defining an interval of $k$ bucket-brigade stages limits the D.C. level shift to that ($\delta$ V volts) which occurred in the first BBDL interval in the FIG. 2 illustration. Therefore, assuming again that the analog input signal $s(t)$ is of peak-to-peak amplitude somewhat less than the dynamic range window of the circuit, there will be no clipping of either peak since the D.C. level shift in the first BBDL interval is not sufficient to cause such limiting action.

Referring now to FIG. 3 there is shown our invention in block diagram form wherein compensating stages 30 are spaced at regular intervals of $k$ bucket-brigade stages along the delay line. The BBDL is illustrated as having a length of four $k$ bucket-brigade stages wherein $k$ is any even interger. The number of compensating nodes (and stages) is one less than the number of selected brigade intervals, and thus for the four interval BBDLs illustrated in FIG. 3, three compensating stages (and corresponding nodes) are utilized. The purpose of the compensating stages is to inject carriers (holes or electrons) into specific buckets of the delay line so that a compensating level-shift of the signal voltage occurs at such nodes. The magnitude of the compensating level-shift is controlled to be equal to, and the polarity of the shift is opposite to, that which occurs between two such compensating nodes as a result of the charge loss (or gain) mechanisms described hereinabove. Thus, if the predominant loss mechanism is the reverse leakage loss, whereby a net level-shift of $+\delta$ V volts occurs every $k$ stages for p-channel transistor devices, the compensating stages each consist of a charge-pumping device (in the case of a MOSFET brigade, or equivalent current device for a JFET or MESFET brigade) that is controlled to provide a current flow from the compensating node in a direction opposite to that of the leakage current in the brigade to thereby change the potential of each $k$th bucket except the last by $-\delta$ V volts during each period of the bucket-brigade clock pulses. In this manner, any reduction in dynamic range due to junction leakage is limited to $\delta$ V volts, regardless of the total length of the delay line. In like manner, if the predominant loss mechanism is charge-pumping, or its equivalent, the compensating stages each consist of a controlled current device for changing the $k$th bucket potentials by $+\delta$ V and thereby again limiting the reduction in dynamic range to $\delta$ V.

The compensating stages 30 indicated generally in the FIG. 3 block diagram each consist of an electronic device 40 and means 41 for controlling the output thereof. In the case wherein the anticipated predominant loss mechanism is charge-pumping, or its equivalent, the electronic device can be virtually any electronic device capable of providing a controlled current output which is in the same direction as the leakage current. Thus, the device in such case is preferably an integrated circuit transistor of the same type used in the BBDL if the BBDL is fabricated in monolithic integrated circuit form, but can also be a discrete transistor device or even a vacuum tube whether or not the BBDL is a monolithic integrated circuit. The transistor can be of the bipolar type (for bipolar transistor BBDLs) in which case the collector or emitter current output is controlled by controlling the base current input thereto, or can be of the field-effect type (for field-effect transistor BBDLs) in which case the source or drain current output is controlled by controlling the gate voltage thereof. For convenience, the output electrode of the field effect device will be described as the source electrode, although it is recognized that the source and drain electrodes are interchangeable.

In the case wherein the anticipated predominant loss mechanism in junction leakage current, the electronic device 40 is one capable of providing controlled charge-pumping or its equivalent, that is, a current having a direction opposite to that of the leakage current. The preferred compensating device is, of course, as noted above, of the same type as that used in the BBDL for uniformity in fabrication. In the case of a MOSFET brigade, the compensating stage MOSFET 40 is the preferred gate-controlled semiconductor device due to its versatility in operating in either of the two desired compensating modes. In either compensation application, the source (or drain) electrode of each compensating device 40 is connected to the compensating node of the BBDL at the appropriate $k$th bucket-brigade stage. The gate electrode of device 40 is connected to the output of a control gate waveform generator 41 which is of conventional circuitry and preferably has a frequency adjustment control for varying the frequency or repetition rate of the pulsed output thereof, an amplitude adjustment control for varying the amplitude of the voltage pulses and a pulse width adjustment control for varying the duration of the pulses. Although all three adjustment controls are preferably available for obtaining the maximum versatility in obtaining the desired compensation, the frequency adjustment control is by far the most significant and can in many applications provide the necessary degree of compensation. The amplitude adjustment control is the next most important control. In the case of compensation for predominant junction leakage current loss mechanism, pulse amplitude adjustment control is not very significant, and pulse width control has no significance since charge-pumping occurs only when the MOSFET device is turned off, i.e., at the trailing end of the gate pulse. In the case of compensation for predominant charge-pumping mechanism, pulse amplitude and pulse width adjustment controls are equally important since they determine the magnitude and duration of the compensating (leakage) current.

In applications wherein the reverse leakage current across p-n junctions is the predominant loss mechanism, the drain (or source) electrode of compensating device connected to a source of D.C. voltage $V_{b3}$ having the same polarity as voltages $V_{b1}$ and $V_{b2}$. This connection to the voltage source is necessary for the case wherein device 40 is a JFET or MESFET, and provides enhanced compensation where device 40 is a MOSFET, although the compensating stage is operable for the MOSFET embodiment by being the drain (or source) electrode left open in the indicated third position of switch 42. In applications wherein the charge-pumping or equivalent phenomenon predominates, the drain (or source) electrode is grounded (connected to the substrate). Each compensating stage can be operated in a charge-pumping (or equivalent) loss compensation or reverse leakage current loss compensation mode by means of a switch 42 connected in the drain (or source) electrode circuit of compensating device 40. In the illustrated first position of switch 42, the drain (or source) electrode of device 40 is connected to D.C. voltage source $V_{b3}$ whereas in the second position it is connected to ground. For additional purposes of versatility, a switch 43 is connected between the node of the BBDL to which the compensating stage is connected and the source (or drain) electrode of device 40 whereby in the illustrated position of such switch the controlled compensating device 40 is not connected to the BBDL node, and in the second position the switch completes the circuit from the source (or drain) electrode of device 40 to the selected node of the BBDL. The degree of compensation provided by the compensating stage 30 is determined by the amplitude of the D.C. voltage $V_{b3}$ and by the controlled gate voltage applied to the gate electrode of device 40 and which is supplied from externally controlled gate waveform generator 41 and thus the compensation is achieved independently of the BBDL circuit. The amount of compensation required is, of course, unique to each specific BBDL circuit and depends on many factors including the BBDL fabrication process utilized and the number (k) of stages in each regular interval of the BBDL. The frequency of the compensating control gate voltage pulses must be higher than the BBDL clock frequency and typically is in the order of 10 times the clock frequency. The higher the frequency of the gate voltage pulses provided by generator 41 the less disruptive is its effect on the sampled signal. The voltage amplitude of the pulse output of generator 41 must, of course, exceed the "turn-on" or "turn-off" voltage of the compensating device 40 for enhancement-and depletion-mode devices, respectively. Thus, in the case where device 40 is an enhancement-mode MOSFET, the amplitude of the output of generator 41 must exceed the device 40 threshold voltage. In case device 40 is a JFET or MESFET, the amplitude must exceed the device pinch-off voltage. As stated above, in the case of charge-pumping (or equivalent) compensation, the pulse duration is not significant, but for leakage current compensation the magnitude of the compensating current is a function of pulse width (in addition to being a function of pulse frequency and pulse amplitude), and the pulse width therefore range up to a 50 percent duty factor. The waveform of the pulse output of generator 41 is not critical, the only criterion being that it be a unipolarity pulse for the JFET or MESFET embodiment of the compensating device. In the case of MOSFET or bipolar compensating devices, the pulses can be of bipolarity although only one polarity of it is useful. In the case of p-channel type device 40, the useful polarity of the pulses are negative, for n-channel they are positive. And since device 40 may be fabricated in the same manner as the transistors in the BBDL, the compensating stage may be made an integral part of the BBDL circuit such that it can be incorporated onto the same integrated circuit chip.

As an example of the effect of our compensating stages on the operation of a MOSFET BBDL circuit, in the case of high frequency circuit operation wherein charge-pumping predominates in that positive charge is lost to the substrate for a p-channel device BBDL, switch 42 is actuated to the drain electrode grounded position to thereby have MOSFET 40 function as a controlled leakage current device. The compensating effect is to allow negative charge to flow from the source region of MOSFET 40 into the substrate. For a BBDL clock frequency of 10 kHz, analog input signal $s(t)$ frequency of 500 Hz and having a peak-to-peak amplitude of 4 volts, the frequency of the output of control gate waveform generator 41 was adjusted to 1 MHz, the amplitude adjusted to 3 volts and the pulse width to 0.1 microsecond resulting in a D.C. level shift of approximately 1 volt in the positive polarity direction in the BBDL sampled signal occurring at the selected node.

In a low frequency circuit application of our compensating stages wherein the leakage current loss predominates, switch 42 is actuated to a drain electrode open position whereby MOSFET 40 function as a controlled charge-pumping device. For a BBDL clock frequency of 2 kHz and analog input signal frequency of 250 Hz, the control gate waveform was adjusted for a frequency of 1 MHz, amplitude of 10 volts and a pulse width of 0.5 microseconds to provide a negative shift in the voltage level of the sampled signal of approximately 1 volt at the same BBDL node.

From the foregoing description, it can be appreciated that our invention makes available a new means for compensation of undesired D.C. voltage level shifts in the analog signal being propagated through a charge-transfer delay line. The compensating means preferably consists of transistor devices of the same type as utilized in the delay line, such as the field-effect type spaced at regular intervals along the delay line and having their drain (or source) electrodes connected to a source of D.C. voltage or left open (for the MOSFET embodiment) for controllably shifting the signal level in a negative voltage direction and having the drain (or source electrodes grounded for controllably shifting the signal level in a position voltage direction for a p-channel field-effect type transistor device bucket-brigade delay line. Proper selection especially of the frequency of the control gate voltage applied to the compensating devices limits the undesired D.C. level shift in the BBDL to that amount which occurs in one of the regular intervals at which the compensating stages are spaced along the delay line.

Having described our invention with respect to to a p-channel BBDL circuit application, it is believed obvious that modification and variation of our invention is possible in the light of the above teachings. Thus, in the case of the BBDL transistor devices (in the delay line stages and compensating stages) being of n-channel type, the polarity of the voltage pulse output of generator 41 is merely reversed to obtain the aforementioned controlled charge-pumping (or equivalent) and leakage current compensation. Finally, as stated hereinabove, compensating stages are not limited to compensating for undesired D.C. voltage level shifts in only field-effect transistor or bipolar transistor type BBDL circuits, but are also useful for compensating for such D.C. voltage level shifts in other charge-transfer delay line circuits such as the charge-coupled type or the surface-charge transistor device type and due to any phenomenon whether or not it can readily be defined. In the case of the charge-coupled or surface-charge transistor device delay lines, an additional surface-potential-sensing diffusion would be required in the fabrication thereof to which the source (or drain) electrode of the compensating device would be connected. It is, therefore, to be understood that changes may be made in the particular embodiment of our invention as described which are within the full intended scope of the invention as defined by the following claims.

What I claim as new and desire to secure by Letters Patent is:

1. A charge-transfer delay line circuit having compensation for undesired shifts in D.C. voltage level of an analog signal being propagated through the delay line due to undesired charge loss to, or gain from, the substrate independent of the analog signal and comprising an input sampling stage for sampling an analog signal applied to an input thereof, a plurality of serially connected delay line stages wherein a first of said delay line stages has an input connected to an output of said input sampling stage, an output stage having an input connected to an output of a last of said delay line stages, and means independent of said delay line stages and the analog signal and spaced at regular intervals along said plurality of delay line stages and having only first ends connected thereto for compensating for undesired shifts in the D.C. voltage level of the sampled analog signal being propagated through the delay line stages due to undesired charge loss in the substrate on which the delay line circuit is fabricated as a result of reverse leakage current across p-n junctions in the circuit or due to charge gain in the substrate as a result of a charge-pumping phenomenon, the compensation being independent of the capacitance of any fixed device in the compensating means.

2. The charge-transfer delay line circuit set forth in claim 1 wherein said charge-transfer delay line circuit including said compensating means is a monolithic integrated circuit formed on a single integrated circuit chip.

3. The charge-transfer delay line circuit set forth in claim 1 wherein said compensating means comprise at least one electronically controlled charge-pumping device having an output connected to an associated at least one selected node along said delay line stages which defines the regular intervals, said compensating device providing a controllable compensating D.C. voltage level shift equal to, and of polarity opposite to, that of the undesired level shift which occurs in one of the regular intervals along the delay line stages.

4. The charge-transfer delay line circuit set forth in claim 1 wherein said compensating means comprise at least one electronically controlled current device having an output connected to an associated at least one selected node along said delay line stages which defines the regular intervals, said current device providing a controllable compensating D.C. voltage level shift equal to, and of polarity opposite to, that of the undesired level shift which occurs in one of the regular intervals along the delay line stages.

5. The charge-transfer delay line circuit set forth in claim 1 wherein said compensating means comprise at least one electronically controlled device having an output connected to an associated at least one selected node along said delay line stages which defines the regular intervals, said controlled device selectively operable as a controlled charge-pumping device in a first mode of operation thereof and operable as a controlled current device in a second mode of operation thereof, said controlled device providing a controllable compensating D.C. voltage level shift equal to, and of polarity opposite to, that of the undesired level shift which occurs in one of the regular intervals along the delay line stages.

6. The charge-transfer delay line circuit set forth in claim 3 wherein said compensating means further comprise means fo controlling the output of said electronically controlled device from a source independent of said delay line stages.

7. The charge-transfer delay line circuit set forth in claim 4 wherein said compensating means further comprise means for controlling the output of said current device from a source independent of said delay line stages.

8. The charge-transfer delay line circuit set forth in claim 5 wherein said compensating means further comprise means for controlling the output of said electronically controlled device from a source independent of said delay line stages.

9. The charge-transfer delay line circuit set forth in claim 6 wherein said electronically controlled device output controlling means comprises a controlled waveform generator providing a controlled voltage pulse output having a repetition rate greater than the repetition rate of clock pulses supplied to said delay line stages for propagating the sampled analog signal therethrough.

10. The charge-transfer delay line circuit set forth in claim 7 wherein said current device output controlling means comprises a controlled waveform generator providing a controlled voltage pulse output having a repetition rate greater than the repetition rate of clock pulses supplied to said delay line stages for propagating the sampled analog signal therethrough.

11. The charge-transfer delay line circuit set forth in claim 8 wherein said electronically controlled device output controlling means comprises a controlled waveform generator providing a controlled voltage pulse output having a repetition rate greater than the repetition rate of clock pulses supplied to said delay line stages for propagating the sampled analog signal therethrough.

12. The charge-transfer delay line circuit set forth in claim 1 wherein said compensating means comprises at least one controlled semiconductor device operable as a controlled charge-pumping device and having an output connected to an associated at least one selected node along said delay line stages which defines the regular intervals.

13. The charge-transfer delay line circuit set forth in claim 1 wherein said compensating means comprises at least one controlled semiconductor device operable as a controlled leakage current device and having an output connected to an associated at least one selected node along said delay line stages which defines the regular intervals.

14. The charge-transfer delay line circuit set forth in claim 1 wherein said compensating means comprises at least one controlled semiconductor device selectively operable as a controlled leakage current device in a first mode of operation and as a controlled charge-pumping device in a second mode of operation thereof and having an output connected to an associated at least one selected node along said delay line stages which defines the regular intervals.

15. The charge-transfer delay line circuit set forth in claim 14 wherein said plurality of delay line stages comprise a plurality of serially connected field-effect transistor devices of number equal to twice the plurality of delay line stages, and a like plurality of capacitors connected between gate and drain electrodes of corresponding said field-effect transistor devices, the capacitors functioning as temporary charge storage sites for storing the sampled portions of the analog signal applied to the input of said sampling stage, the field-effect transistor devices being sequentially switched to conductive and nonconductive states for propagating the sample analog signal through the delay line stages at the rate at which the transistor devices are switched between states so that the delay line circuit is of the bucket-brigade type, said at least one controlled semiconductor device having an output connected to an associated at least one juncture of selected two of said field-effect transistor devices which defines the at least one selected node along said delay line stages.

16. The bucket-brigade delay line circuit set forth in claim 15 wherein said controlled semiconductor device is a gate-controlled field-effect type transistor having an interchangeable source or drain electrode connected to the juncture of the selected two said field-effect transistor devices.

17. The bucket-brigade delay line circuit set forth in claim 16 wherein said transistors are all of the same field-effect type.

18. The bucket-brigade delay line circuit set forth in claim 17 wherein said compensating means field-effect transistor has a gate electrode connected to an output of a controlled waveform generator providing a controlled voltage pulse output having a repetition rate greater than the repetition rate of clock pulses supplied to the field-effect transistor devices in the delay line stages for propagating the sampled analog signal therethrough.

19. The bucket-brigade delay line circuit set forth in claim 18 wherein said compensating means field-effect transistor has an electrode which is the other of the interchangeable source or drain electrode and which is connected to a source of D.C. voltage to thereby cause said compensating field-effect transistor to be operable as a controlled current device to provide a current flow from the compensating node in a direction which is opposite to that resulting from leakage current in the delay line stages.

20. The bucket-brigade delay line circuit set forth in claim 18 wherein said compensating means field-effect transistor is a metal-oxide-silicon field-effect transistor having an electrode which is the other of the interchangeable source or drain electrode and which is left open to thereby cause said compensating field-effect transistor to be operable as a controlled charge-pumping device.

21. The bucket-brigade delay line circuit set forth in claim 18 wherein said compensating means field-effect transistor has an electrode which is the other of the interchangeable source or drain electrode and which is connected to ground to thereby cause said compensating field-effect transistor to be operable as a controlled leakage current device wherein the direction of the controlled leakage current being opposite to that resulting from charge pumping or other equivalent phenomenon within the delay line stage.

22. The charge-transfer delay line circuit set forth in claim 11 wherein said controlled waveform generator is provided with means for adjusting the repetition rate of the voltage pulse output thereof.

23. The charge-transfer delay line circuit set forth in claim 22 wherein said controlled waveform generator is further provided with means for controlling the amplitude of the voltage pulse output thereof.

24. The charge-transfer delay line circuit set forth in claim 21 wherein said controlled waveform generator is further provided with means for adjusting the duration of the voltage pulse output thereof, the duration of pulses being in a range up to a 50 percent duty factor.

25. The charge transfer delay line circuit set forth in claim 11 wherein the frequency of the voltage pulses provided by said controlled waveform generator is approximately 10 times the clock frequency.

26. The charge-transfer delay line circuit set forth in claim 11 wherein the amplitude of the voltage pulses provided by said controlled waveform generator exceeds the turn-on voltage of said electronically controlled device.

27. The bucket-brigade delay line circuit set forth in claim 17 and further comprising a switch connected in the other of the interchangeable source or drain electrode circuit of said compensating field-effect type transistor for obtaining the two modes of operation thereof.

* * * * *